United States Patent
Park et al.

(10) Patent No.: US 8,937,489 B2
(45) Date of Patent: Jan. 20, 2015

(54) INVERTER AND SCAN DRIVER USING THE SAME

(75) Inventors: Yong-Sung Park, Yongin (KR); Dong-Yong Shin, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 362 days.

(21) Appl. No.: 13/277,985

(22) Filed: Oct. 20, 2011

(65) Prior Publication Data

US 2012/0206168 A1 Aug. 16, 2012

(30) Foreign Application Priority Data

Feb. 10, 2011 (KR) .................. 10-2011-0011957

(51) Int. Cl.
*H03K 19/094* (2006.01)
*H03K 3/01* (2006.01)
*H03K 19/003* (2006.01)
*H03K 19/20* (2006.01)

(52) U.S. Cl.
CPC .......... *H03K 19/20* (2013.01); *H03K 19/00384* (2013.01)
USPC ................. 326/83; 326/27; 326/34; 327/206; 327/537; 327/534

(58) Field of Classification Search
USPC ........ 327/427, 534–538, 543; 326/80, 81, 83, 326/27, 34
See application file for complete search history.

(56) References Cited

U.S. PATENT DOCUMENTS

| | | | | |
|---|---|---|---|---|
| 6,177,831 B1 * | 1/2001 | Yoneda et al. | ................ | 327/537 |
| 6,977,524 B2 * | 12/2005 | Huber et al. | .................... | 326/80 |
| 7,002,372 B2 * | 2/2006 | Huber et al. | .................... | 326/81 |
| 7,005,711 B2 * | 2/2006 | King | ............................. | 257/368 |
| 7,205,525 B2 * | 4/2007 | Yasaitis | ...................... | 250/214.1 |
| 7,315,196 B2 * | 1/2008 | Wada | ............................ | 327/536 |
| 7,969,226 B2 * | 6/2011 | Kelley | .......................... | 327/424 |
| 2008/0272816 A1 * | 11/2008 | Afentakis et al. | ............. | 327/206 |
| 2010/0117704 A1 * | 5/2010 | Afentakis et al. | ............. | 327/206 |
| 2011/0273419 A1 | 11/2011 | Park et al. | | |

FOREIGN PATENT DOCUMENTS

| | | |
|---|---|---|
| KR | 10-2007-0002784 A | 1/2007 |
| KR | 10-2007-0022550 A | 2/2007 |
| KR | 10-2010-0073294 A | 7/2010 |
| KR | 10-2011-0123984 | 11/2011 |

* cited by examiner

*Primary Examiner* — Vibol Tan
(74) *Attorney, Agent, or Firm* — Christie, Parker & Hale, LLP (57) ABSTRACT

An inverter is capable of improving the reliability of driving. The inverter includes a first transistor and a second transistor. The first transistor is coupled between a first power source and an output terminal of the inverter, and has a first gate electrode coupled to a first input terminal of the inverter and a second gate electrode coupled to a third power source. The second transistor is coupled between the output terminal and a second power source, and has a first gate electrode coupled to a second input terminal of the inverter and a second gate electrode coupled to the third power source.

22 Claims, 9 Drawing Sheets

INVERTER AND SCAN DRIVER USING THE SAME

CROSS-REFERENCE TO RELATED APPLICATION

This application claims priority to and the benefit of Korean Patent Application No. 10-2011-0011957, filed on Feb. 10, 2011, in the Korean Intellectual Property Office, the entire content of which is incorporated herein by reference.

BACKGROUND

1. Field

Aspects of embodiments according to the present invention relate to an inverter and a scan driver using the same, and more particularly, to an inverter capable of improving the reliability of driving and a scan driver using the same.

2. Description of Related Art

Recently, various flat panel displays (FPDs) with reduced weight and volume in comparison to cathode ray tubes (CRT) have been developed. The FPDs include a liquid crystal display (LCD), a field emission display (FED), a plasma display panel (PDP), and an organic light emitting display.

Among the FPDs, the organic light emitting display displays an image using organic light emitting diodes (OLEDs) that generate light by re-combination of electrons and holes. The organic light emitting display has high response speed and is driven with low power consumption. In a typical organic light emitting display, current corresponding to data signals is supplied to the OLEDs using transistors formed in pixels so that light is emitted by the OLEDs.

The typical organic light emitting display includes a data driver for supplying the data signals to data lines, a scan driver for sequentially supplying scan signals to scan lines, and a pixel unit including a plurality of pixels coupled to the scan lines and the data lines.

The pixels included in the pixel unit are selected when the scan signals are supplied to the scan lines in order to receive the data signals from the data lines. The pixels that receive the data signals generate light with brightness (e.g., predetermined brightness) corresponding to the data signals and display an image (e.g., a predetermined image).

On the other hand, the scan driver includes stages coupled to the scan lines. Each of the stages includes a plurality of transistors in order to supply the scan signals to the scan lines. P-type (for example, PMOS) or N-type (for example, NMOS) transistors that constitute the stages are formed in a panel together with the pixels. When the stages are formed in the panel together with the pixels, manufacturing cost is reduced.

However, when the stage is realized by N-type transistors, the turn-off operation of the transistors is not satisfactorily controlled due to the threshold voltage Vth shift of the transistors, and an erroneous operation may be caused. That is, in the case of the N-type transistors, the threshold voltage Vth is negatively shifted during operation so that the transistor is not turned off in a state where a voltage Vgs between a gate and a source is about 0V (e.g., Vgs=0V).

SUMMARY

Aspects of embodiments of the present invention are directed toward an inverter capable of improving the reliability of driving and a scan driver using the same.

According to an embodiment of the present invention, there is provided an inverter, including a first transistor coupled between a first power source and an output terminal of the inverter, and having a first gate electrode coupled to a first input terminal of the inverter and a second gate electrode coupled to a third power source; and a second transistor coupled between the output terminal and a second power source, and having a first gate electrode coupled to a second input terminal of the inverter and a second gate electrode coupled to the third power source.

The first power source may be configured to output a voltage that is higher than that of the second power source, and the second power source may be configured to output a voltage that is higher than that of the third power source. In each of the first transistor and the second transistor, when a voltage supplied to the second gate electrode is lower than a voltage supplied to a source electrode thereof, a threshold voltage may be positively shifted. Each of the first input terminal and the second input terminal may receive a voltage of the second power source or the first power source. The first transistor and the second transistor may be NMOS transistors. The inverter may further include a third transistor coupled between the first power source and the second gate electrode of the first transistor, and having a gate electrode coupled to the first input terminal; and a fourth transistor coupled between the second gate electrode of the first transistor and the second power source, the fourth transistor being configured to be turned on or off to correspond to a voltage supplied to the second input terminal. The fourth transistor may further include a second gate electrode, and the second gate electrode of the fourth transistor is coupled to a fourth power source that is configured to output a voltage lower than the third power source.

An inverter according to another embodiment of the present invention includes a first transistor coupled between a second input terminal of the inverter and an output terminal of the inverter, and having a first gate electrode coupled to a first input terminal of the inverter and a second gate electrode coupled to a first node; a first capacitor coupled between the first gate electrode of the first transistor and the output terminal; a second transistor coupled between the output terminal and a second power source, and having a first gate electrode coupled to a third input terminal and a second gate electrode coupled to a third power source; a third transistor having a first electrode coupled to a first power source or the first input terminal, a second electrode coupled to the first node, and a gate electrode coupled to the first input terminal; a second capacitor coupled between the first node and the output terminal; and a fourth transistor coupled between the first node and the third power source and having a gate electrode coupled to the third input terminal.

The first power source may be configured to output a voltage that is higher than that of the second power source, and the second power source may be configured to output a voltage that is higher than that of the third power source. In each of the first transistor and the second transistor, when a voltage supplied to the second gate electrode is lower than a voltage supplied to a source electrode thereof, a threshold voltage may be positively shifted. A clock signal that rises from the voltage of the second power source to the voltage of the first power source may be supplied to each of the first input terminal through the third input terminal. The clock signal may be supplied to the first input terminal to the third input terminal in the order of the first input terminal, the second input terminal, and the third input terminal. The first to fourth transistors may be NMOS transistors. The fourth transistor may further include a second gate electrode, and the second gate electrode of the fourth transistor is coupled to a fourth power source that is configured to output a voltage that is lower than that of the third power source.

A scan driver according to an embodiment of the present invention includes stage circuits coupled to scan lines in order to sequentially supply scan signals to the scan lines. Each of the stage circuits includes anyone of the above described inverters.

A scan driver according to another embodiment of the present invention includes stage circuits coupled to scan lines in order to sequentially supply scan signals to the scan lines. Each of the stage circuits includes an inverter for supplying a corresponding one of the scan signals to an output terminal of the stage circuit to correspond to voltages respectively applied to a second node and a third node, and an input controller for controlling the voltages applied to the second node and the third node. The inverter includes a first transistor coupled between a second input terminal of the stage circuit and the output terminal, and having a first gate electrode coupled to the second node and a second gate electrode coupled to a first node; a first capacitor coupled between the second node and the output terminal; a second transistor coupled between the output terminal and a second power source, and having a first gate electrode coupled to the third node and a second gate electrode coupled to a third power source; a third transistor coupled between a stage input terminal of the stage circuit and the first node, and having a gate electrode coupled to a first input terminal of the stage circuit; a second capacitor coupled between the first node and the output terminal; and a fourth transistor coupled between the first node and the third power source and having a first gate electrode coupled to a third input terminal of the stage circuit and a second gate electrode coupled to a fourth power source.

A clock signal that rises from a voltage of the second power source to a voltage of the first power source may be supplied to each of the first input terminal through the third input terminal. The clock signal may be supplied to the first input terminal through the third input terminal in the order of the first input terminal, the second input terminal, and the third input terminal. The first power source may be configured to output a voltage that is higher than that of the second power source. The second power source may be configured to output a voltage that is higher than that of the third power source. The third power source may be configured to output a voltage that is higher than that of the fourth power source. In the transistors including the first gate electrode and the second gate electrode, when a voltage supplied to the second gate electrode is lower than a voltage supplied to the source electrode thereof, a threshold voltage may be positively shifted. The transistors included in the inverter and the input controller may be NMOS transistors. The sampling signal or the start signal of a previous stage may be input to the stage input terminal in synchronization with a clock signal supplied to the first input terminal.

The input controller includes a fifth transistor coupled between a first power source and the third node and having a first gate electrode coupled to the third input terminal, a sixth transistor coupled between the stage input terminal and the second node and having a first gate electrode coupled to the first input terminal, a seventh transistor coupled between the third node and the second power source and having a first gate electrode coupled to the stage input terminal and a second gate electrode coupled to the third power source, an eighth transistor coupled between the second node and the second power source and having a first gate electrode coupled to the third node and a second gate electrode coupled to the third power source, a ninth transistor coupled between the stage input terminal and the second gate electrode of the sixth transistor and having a gate electrode coupled to the first input terminal, a tenth transistor coupled between the third power source and the second gate electrode of the sixth transistor and having a first gate electrode coupled to the second input terminal and a second gate electrode coupled to the fourth power source, an eleventh transistor coupled between the first power source and the second gate electrode of the fifth transistor and having a gate electrode coupled to the third input terminal, a twelfth transistor coupled between the second gate electrode of the fifth transistor and the third power source and having a first gate electrode coupled to the first input terminal and a second gate electrode coupled to the fourth power source, and a third capacitor coupled between the third node and the second power source.

According to the above described embodiments, in the inverter and the scan driver using the same, a low voltage is applied to the second gate electrode of the double gate transistor to positively shift the threshold voltage of the transistor. In this case, the turn-off operation of the transistor is stabilized so that the reliability of driving may be improved.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE EMBODIMENTS

Hereinafter, certain exemplary embodiments according to the present invention will be described with reference to the accompanying drawings. Here, when a first element is described as being coupled to a second element, the first element may be directly coupled to the second element, or may be indirectly coupled to the second element via one or more third elements. Further, some of the elements that are not essential to the complete understanding of the invention may be omitted for clarity. Also, like reference numerals refer to like elements throughout.

Hereinafter, exemplary embodiments by which those skilled in the art may easily perform the present invention will be described in detail with reference to FIGS. 1 to 15.

Figure 1:
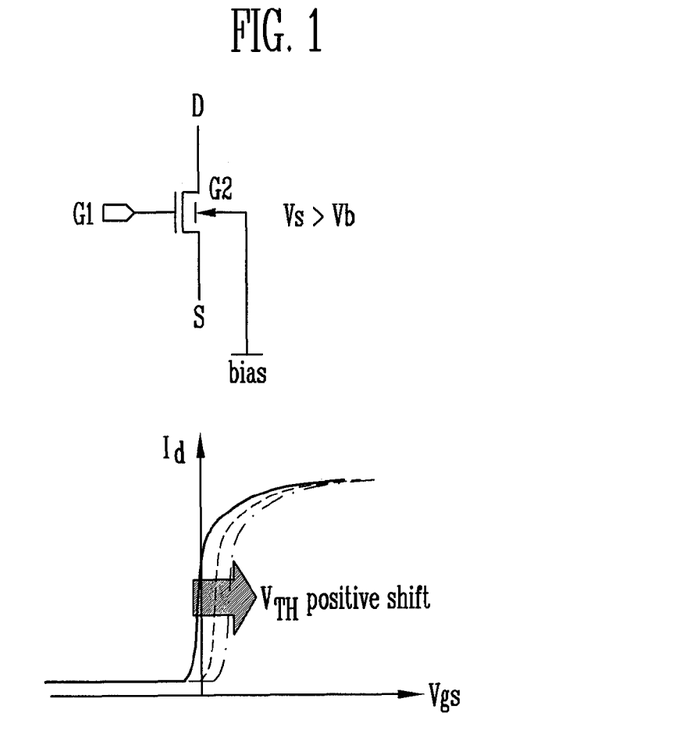
FIG. 1 is a view illustrating the characteristic of a double gate transistor used for an embodiment of the present invention.

FIG. 1 is a view illustrating the characteristic of a transistor used for an embodiment of the present invention.

Referring to FIG. 1, according to an embodiment of the present invention, a transistor (hereinafter, referred to as a double gate transistor) includes a drain electrode D, a source electrode S, and two gate electrodes G1 and G2. The double gate transistor is formed by positioning the first gate electrode G1 and the second gate electrode G2 to face each other with an insulating layer interposed therebetween.

The double gate transistor has a characteristic in which a threshold voltage Vth is shifted to correspond to the voltage supplied to the second gate electrode G2. In detail, when a bias voltage Vb supplied to the second gate electrode G2 is lower than the voltage Vs supplied to the source electrode S, the threshold voltage of the transistor is positively shifted. Here, the degree of the positive shift is determined by a difference between the bias voltage Vb and the voltage Vs of the source electrode. That is, as the difference between the bias voltage Vb and the voltage Vs of the source electrode is large, the change of the threshold voltage Vth is large. When the bias voltage Vb is larger than the voltage Vs of the source electrode, the threshold voltage Vth is ideally converged to 0V.

On the other hand, the voltages supplied to the drain electrode D, the source electrode S, and the first gate electrode G1 of the double gate transistor are suitably set as in a commonly used transistor.

Figure 2:
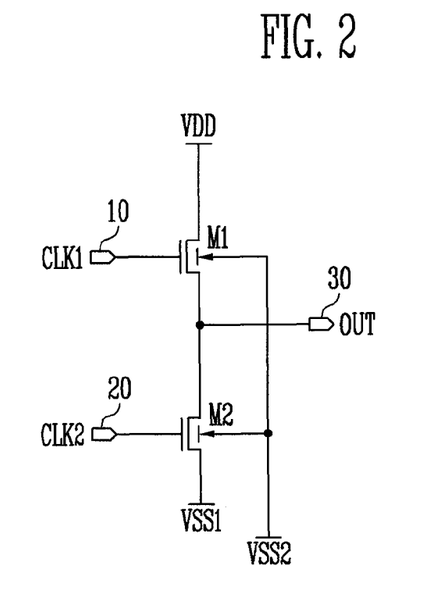
FIG. 2 is a view illustrating an inverter according to a first embodiment of the present invention.

FIG. 2 is a view illustrating an inverter according to a first embodiment of the present invention. Here, the transistors used for the inverter are NMOS transistors.

Referring to FIG. 2, the inverter according to the first embodiment of the present invention includes a first transistor M1 and a second transistor M2 that are serially coupled between a first power source VDD and a second power source VSS1. Here, the first transistor M1 and the second transistor M2 are double gate transistors.

The first electrode of the first transistor M1 is coupled to the first power source VDD, and the second electrode of the first transistor M1 is coupled to an output terminal 30. Then, the first gate electrode of the first transistor M1 is coupled to a first input terminal 10, and the second gate electrode of the first transistor M1 is coupled to a third power source VSS2. The first transistor M1 is turned on or off to correspond to the first clock signal CLK1 that is supplied to the first input terminal 10.

The first electrode of the second transistor M2 is coupled to the output terminal 30, and the second electrode of the second transistor M2 is coupled to the second power source VSS1. The first gate electrode of the second transistor M2 is coupled to a second input terminal 20, and the second gate electrode of the second transistor M2 is coupled to the third power source VSS2. The second transistor M2 is turned on or off to correspond to the second clock signal CLK2 supplied to the second input terminal 20.

Here, the first clock signal CLK1 and the second clock signal CLK2 are supplied to increase from the voltage of the second power source VSS1 to the voltage of the first power source VDD. The first power source VDD is set as a voltage higher than that of the second power source VSS1. Then, the second power source VSS1 is set as a voltage higher than that of the third power source VSS2.

Figure 3:
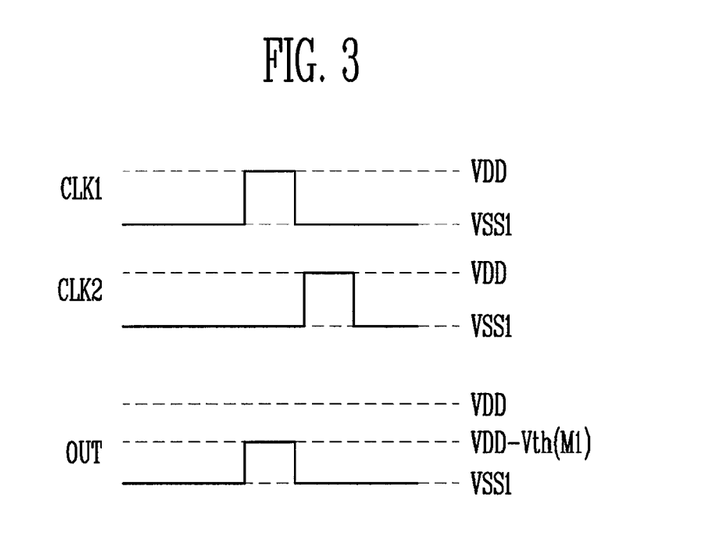
FIG. 3 is a waveform chart illustrating the driving operations of the inverter of FIG. 2.

FIG. 3 is a waveform chart illustrating the driving operations of the inverter of FIG. 2.

Referring to FIG. 3, the first clock signal CLK1 (e.g., a high level voltage) is supplied to the first input terminal 10 so that the first transistor M1 is turned on. When the first transistor M1 is turned on, a high voltage is supplied to the output terminal 30. For example, the high voltage supplied to the output terminal 30 is set as the voltage obtained by subtracting the threshold voltage of the first transistor M1 from the voltage of the first power source VDD.

On the other hand, in a period where the first transistor M1 is turned on, the voltage of the second power source VSS1 is supplied to the source electrode of the second transistor M2 and the voltage of the third power source VSS2 is supplied to the second gate electrode. In this case, the threshold voltage of the second transistor M2 is positively shifted so that the second transistor M2 stably maintains a turn-off state.

Then, the second clock signal CLK2 (e.g., a high level voltage) is supplied so that the second transistor M2 is turned on. When the second transistor M2 is turned on, the voltage of the second power source VSS1 is supplied to the output terminal 30. At this time, the voltage of the second power source VSS1 is supplied to the source electrode of the first transistor M1 and the third power source VSS2 is supplied to the second gate electrode. In this case, the threshold voltage of the first transistor M1 is positively shifted so that the first transistor M1 stably maintains the turn-off state.

Figure 4:
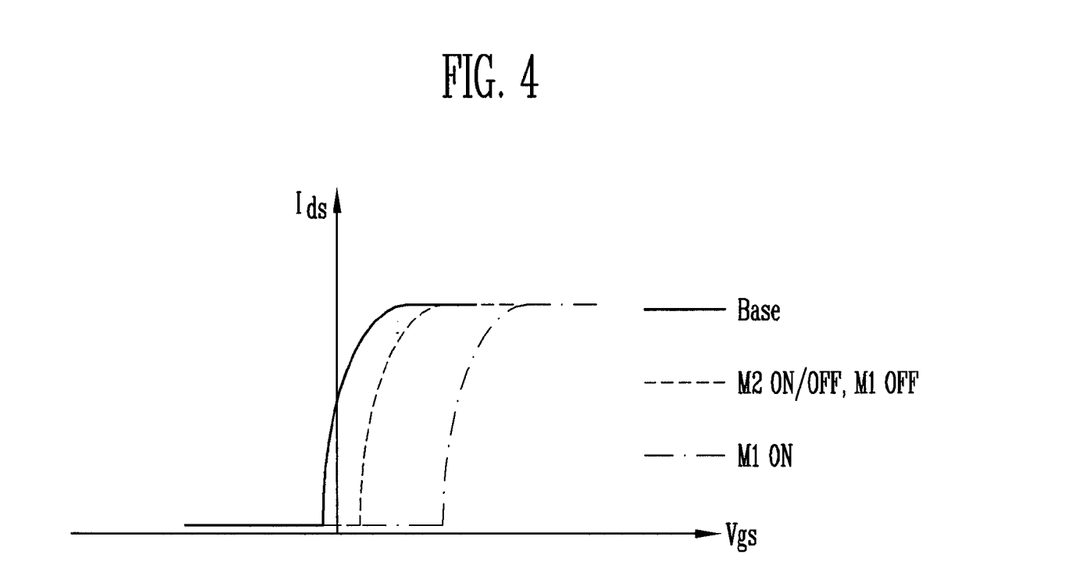
FIG. 4 is a graph illustrating the movement of the threshold voltage of the transistor of FIG. 2.

FIG. 4 is a graph illustrating the movement of the threshold voltage of the transistor of FIG. 2.

Referring to FIG. 4, when the first transistor M1 is turned off and the second transistor M2 is turned on or off, a voltage difference between the source electrode and the second gate electrode of the second transistor M2 is set to be small so that the degree of threshold voltage shift is small. In this case, the on/off characteristic of the second transistor M2 may be stabilized.

However, when the first transistor M1 is turned on, the voltage difference between the source electrode and the second gate electrode of the first transistor M1 is set to be large so that the degree of the threshold voltage shift is large. In this case, the high voltage supplied to the output terminal 30 is set as a much lower voltage than the first voltage VDD. In order to solve the problem, according to an embodiment of the present invention, the inverter circuit of FIG. 5 is additionally suggested.

Figure 5:
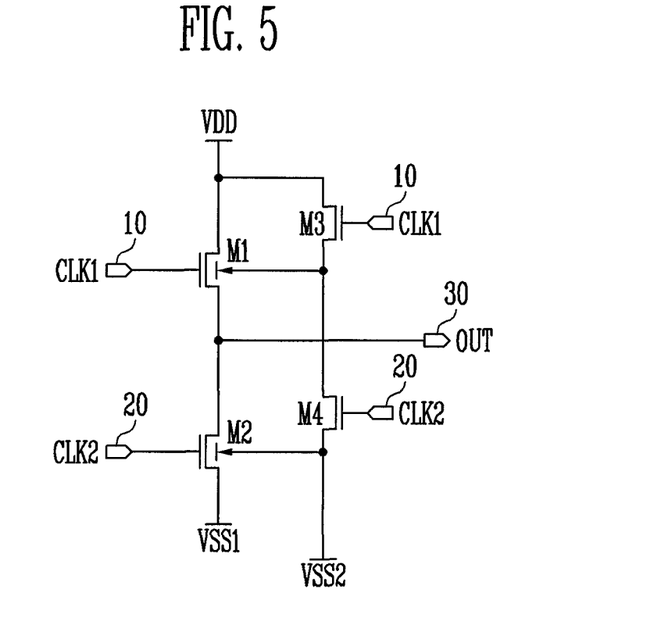
FIG. 5 is a view illustrating an inverter according to a second embodiment of the present invention.

FIG. 5 is a view illustrating an inverter according to a second embodiment of the present invention.

Referring to FIG. 5, the inverter according to the second embodiment of the present invention includes a first transistor M1, a second transistor M2, a third transistor M3, and a fourth transistor M4. The first transistor M1 and the second transistor M2 are formed of the double gate transistors, and the third transistor M3 and the fourth transistor M4 are formed of common transistors (i.e., not double gate transistors).

The first transistor M1 and the second transistor M2 are serially coupled between the first power source VDD and the second power source VSS1. Then, the third transistor M3 and the fourth transistor M4 are serially coupled between the first power source VDD and the third power source VSS2.

The first electrode of the first transistor M1 is coupled to the first power source VDD and the second electrode is coupled to the output terminal 30. Then, the first gate electrode of the first transistor M1 is coupled to the first input terminal 10 and the second gate electrode of the first transistor M1 is coupled to the second electrode of the third transistor M3. The first transistor M1 is turned on or off to correspond to the first clock signal CLK1 supplied to the first input terminal 10.

The first electrode of the second transistor M2 is coupled to the output terminal 30 and the second electrode of the second transistor M2 is coupled to the second power source VSS1. Then, the first gate electrode of the second transistor M2 is coupled to the second input terminal 20 and the second gate electrode of the second transistor M2 is coupled to the third power source VSS2. The second transistor M2 is turned on or off to correspond to the second clock signal CLK2 supplied to the second input terminal 20.

The first electrode of the third transistor M3 is coupled to the first power source VDD and the second electrode of the third transistor M3 is coupled to the second gate electrode of the first transistor M1. Then, the gate electrode of the third transistor M3 is coupled to the first input terminal 10. The third transistor M3 is turned on or off to correspond to the first clock signal CLK1 supplied to the first input terminal 10.

The first electrode of the fourth transistor M4 is coupled to the second gate electrode of the first transistor M1 and the second electrode of the fourth transistor M4 is coupled to the third power source VSS2. The gate electrode of the fourth transistor M4 is coupled to the second input terminal 20. The fourth transistor M4 is turned on or off to correspond to the second clock signal CLK2 supplied to the second input terminal 20.

Figure 6:
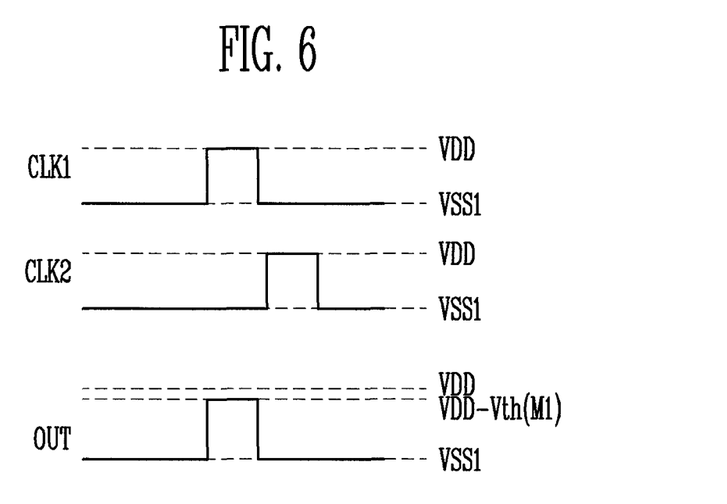
FIG. 6 is a waveform chart illustrating the driving processes of the inverter of FIG. 5.

FIG. 6 is a waveform chart illustrating the driving processes of the inverter of FIG. 5.

Referring to FIG. 6, the first clock signal CLK1 (e.g., a high level voltage) is supplied to the first input terminal 10 so that the first transistor M1 and the third transistor M3 are turned on.

When the third transistor M3 is turned on, the voltage of the first power source VDD is supplied to the second gate electrode of the first transistor M1. When the first transistor M1 is turned on, a high voltage is supplied to the output terminal 30.

Figure 7:
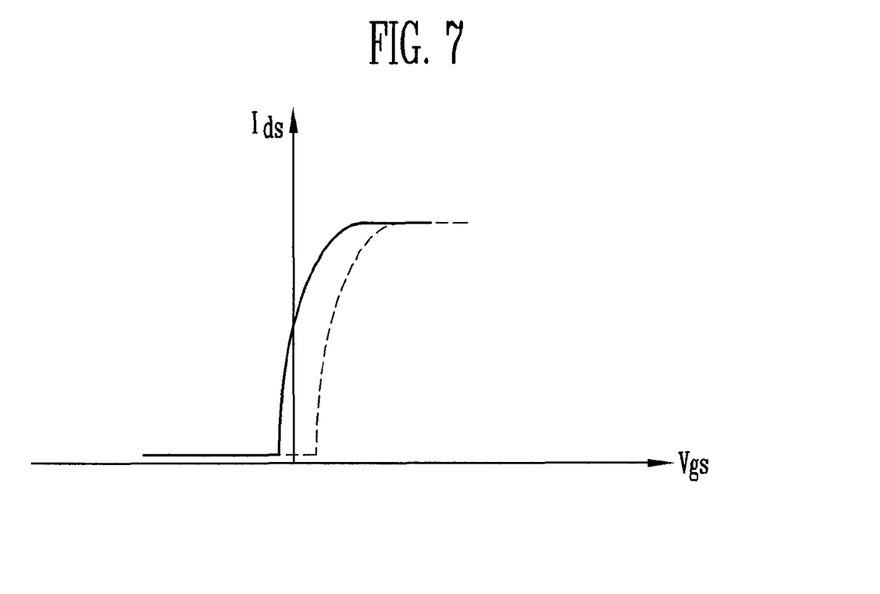
FIG. 7 is a graph illustrating the movement of the threshold voltage of the transistor of FIG. 5.

Here, in a period when the first transistor M1 is turned on, since the voltage of the first power source VDD is supplied to the second gate electrode of the first transistor M1, the threshold voltage shift of the first transistor M1 is minimized or reduced. For example, the threshold voltage of the first transistor M1 is shifted to a positive side by a small voltage as illustrated in FIG. 7. In this case, the high voltage supplied to the output terminal 30 is lower than the first power source VDD.

On the other hand, in a period when the first transistor M1 is turned on, the second power source VSS1 is supplied to the source electrode of the second transistor M2 and the third power source VSS2 is supplied to the second gate electrode. In this case, the threshold voltage of the second transistor M2 is positively shifted so that the second transistor M2 stably maintains the turn-off state.

Then, the second clock signal CLK2 (e.g., a high level voltage) is supplied so that the second transistor M2 and the fourth transistor M4 are turned on. When the second transistor M2 is turned on, the voltage of the second power source VSS1 is supplied to the output terminal 30. When the fourth transistor M4 is turned on, the voltage of the third power source VSS2 is supplied to the second gate electrode of the first transistor M1. At this time, the threshold voltage of the first transistor M1 is positively shifted so that the first transistor M1 stably maintains the turn off state.

Figure 8:
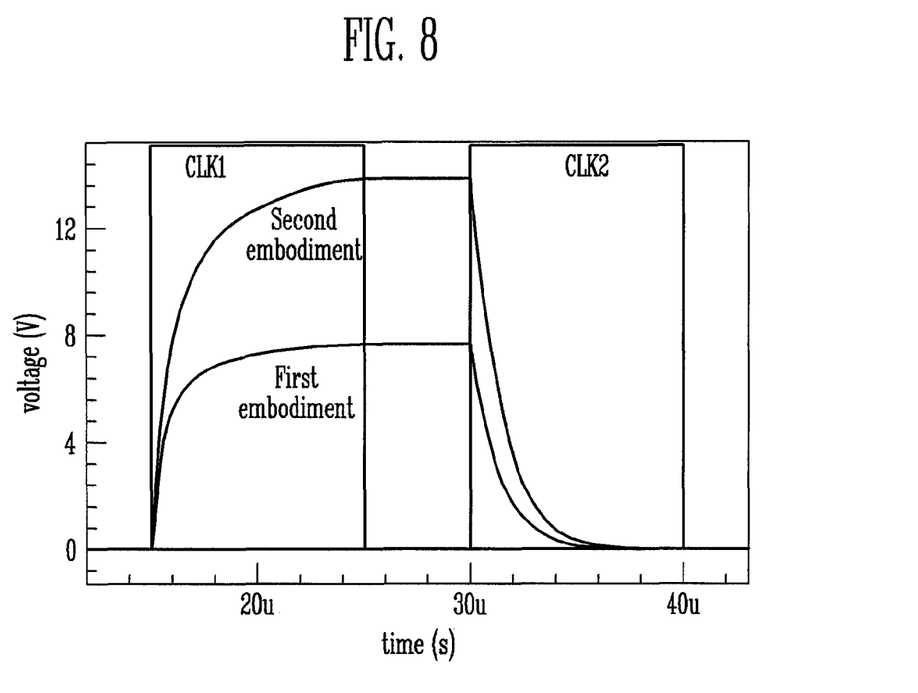
FIG. 8 is a view illustrating the simulation results of the inverters of FIGS. 2 and 5.

FIG. 8 is a view illustrating the simulation results of the inverters according to the first and second embodiments of the present invention. In FIG. 8, a case in which the third power source VSS2 that is lower than the second power source VSS1 by 2V is illustrated.

Referring to FIG. 8, in the inverter according to the first embodiment of the present invention, the high voltage output to the output terminal 30 is set as a voltage lower than the first power source VDD by about 8V. That is, when the first transistor M1 is turned on, the threshold voltage of the first transistor M1 is set as about 8V so that a large voltage drop occurs.

However, in the inverter according to the second embodiment of the present invention, the high voltage output to the output terminal 30 is set as a voltage lower than the first power source VDD by about 2V. That is, when the first transistor M1 is turned on, the threshold voltage of the first transistor M1 is set as about 2V so that a voltage drop may be minimized or reduced.

Figure 9:
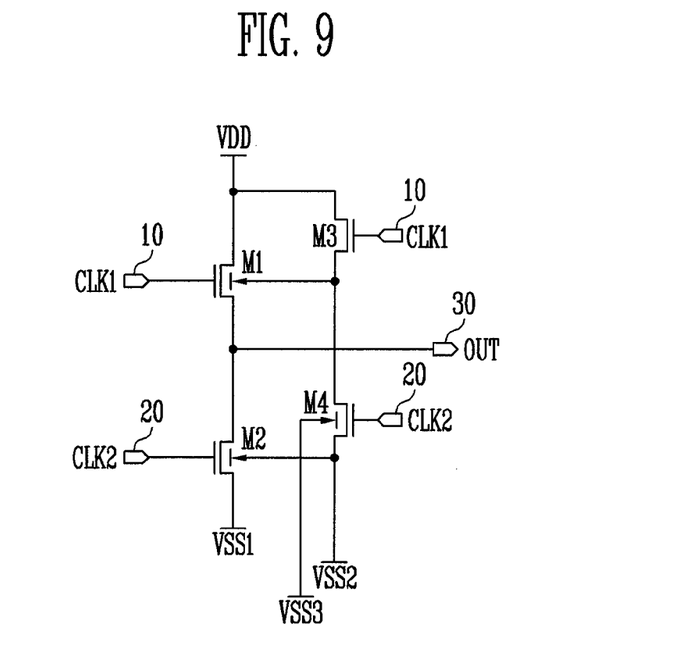
FIG. 9 is a view illustrating an inverter according to a third embodiment of the present invention.

FIG. 9 is a view illustrating an inverter formed using a double gate transistor according to a third embodiment of the present invention. In FIG. 9, the same elements as those of FIG. 5 are denoted by the same reference numerals and detailed description thereof will be omitted.

Referring to FIG. 9, in the inverter according to the third embodiment of the present invention, the fourth transistor M4 is formed of the double gate transistor. The voltage of a fourth power source VSS3 that is lower than the third power source VSS2 is supplied to the second gate electrode of the fourth transistor M4. In this case, the threshold voltage of the fourth transistor M4 is positively shifted so that the fourth transistor M4 may be stably turned off. Since the other operation processes are substantially the same as the inverter according to the second embodiment of the present invention of FIG. 5, detailed description thereof will be omitted.

Figure 10:
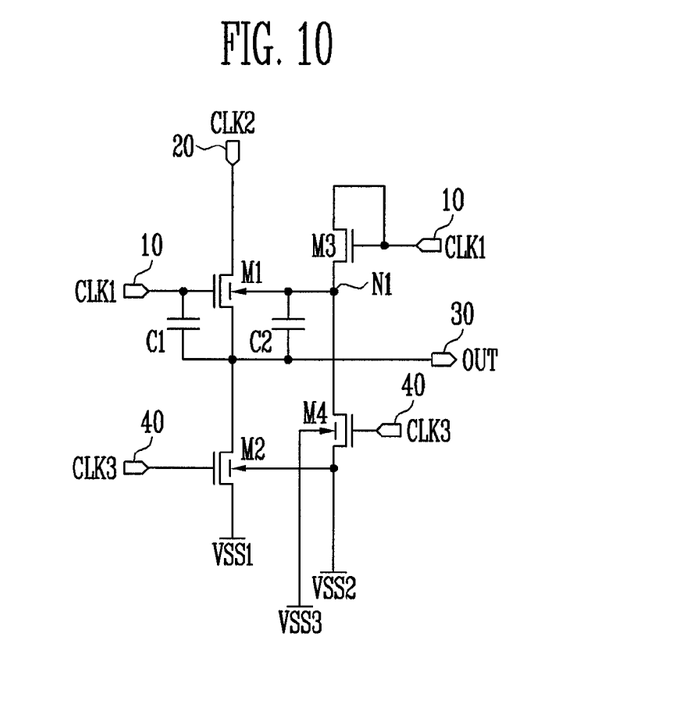
FIG. 10 is a view illustrating an inverter according to a fourth embodiment of the present invention.

FIG. 10 is a view illustrating an inverter according to a fourth embodiment of the present invention.

Referring to FIG. 10, the inverter according to the fourth embodiment of the present invention includes a first transistor M1, a second transistor M2, a third transistor M3, a fourth transistor M4, a first capacitor C1, and a second capacitor C2. Here, the first transistor M1, the second transistor M2, and the fourth transistor M4 are formed of the double gate transistors and the third transistor M3 is formed of a common transistor (i.e., not a double gate transistor).

The first transistor M1 and the second transistor M2 are serially coupled between the second input terminal 20 and the second power source VSS1. The third transistor M3 and the fourth transistor M4 are serially coupled between the first input terminal 10 and the third power source VSS2.

The first electrode of the first transistor M1 is coupled to the second input terminal 20 and the second electrode of the first transistor M1 is coupled to the output terminal 30. Then, the first gate electrode of the first transistor M1 is coupled to the first input terminal 10 and the second gate electrode of the first transistor M1 is coupled to a first node N1. The first transistor M1 is turned on or off to correspond to the first clock signal CLK1 supplied to the first input terminal 10.

The first electrode of the second transistor M2 is coupled to the output terminal 30 and the second electrode of the second transistor M2 is coupled to the second power source VSS1. The first gate electrode of the second transistor M2 is coupled to a third input terminal 40 and the second gate electrode of the second transistor M2 is coupled to the third power source VSS2. The second transistor M2 is turned on or off to correspond to the third clock signal CLK3 supplied to the third input terminal 40.

The first electrode and the gate electrode of the third transistor M3 are coupled to the first input terminal CLK1 and the second electrode of the third transistor M3 is coupled to the first node N1. The third transistor M3 is turned on or off to correspond to the first clock signal CLK1 supplied to the first input terminal CLK1.

The first electrode of the fourth transistor M4 is coupled to the first node N1 and the second electrode of the fourth transistor M4 is coupled to the third power source VSS2. Then, the first gate electrode of the fourth transistor M4 is coupled to the third input terminal 40 and the second gate electrode of the fourth transistor M4 is coupled to the fourth power source VSS3. The fourth transistor M4 is turned on or off to correspond to the third clock signal CLK3 supplied to the third input terminal 40.

The first capacitor C1 is coupled between the gate electrode of the first transistor M1 and the output terminal 30. The first capacitor C1 controls the gate electrode voltage of the first transistor M1 to correspond to the voltage of the output terminal 30.

The second capacitor C2 is coupled between the first node N1 and the output terminal 30. The second capacitor C2 controls the voltage of the first node N1 to correspond to the voltage of the output terminal 30.

Figure 11:
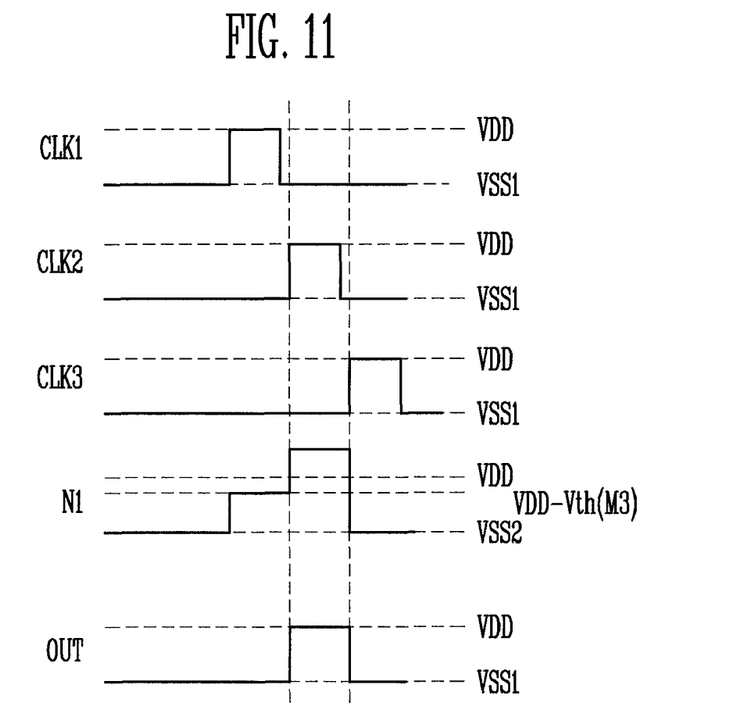
FIG. 11 is a waveform chart illustrating the driving processes of the inverter illustrated in FIG. 10.

FIG. 11 is a waveform chart illustrating the driving processes of the inverter illustrated in FIG. 10.

Referring to FIG. 11, the clock signals CLK1 to CLK3 are supplied in the order of the first clock signal CLK1, the second clock signal CLK2, and the third clock signal CLK3. The clock signals CLK1 to CLK3 swing between the voltages of the first power source VDD and the second power source VSS1.

When the first clock signal CLK1 is supplied (that is, when the VDD voltage is supplied), the first transistor M1 and the third transistor M3 are turned on. When the first transistor M1 is turned on, the second input terminal 20 and the output terminal 30 are electrically coupled to each other. At this time, the second clock signal CLK2 is not supplied to the second input terminal 20 so that the voltage of the second power source VSS1 is output to the output terminal 30. Since the first transistor M1 is turned on, the voltage corresponding to the turn-on operation of the first transistor M1 is charged in the first capacitor C1.

When the third transistor M3 is turned on, the voltage of the first clock signal CLK1 is supplied to the first node N1. Here, since the third transistor M3 is coupled in the form of a diode, the voltage actually supplied to the first node N1 is set as the voltage obtained by subtracting the threshold voltage of the third transistor M3 from the voltage VDD of the first clock signal CLK1. At this time, the second capacitor C2 is charged with a voltage between the first node N1 and the output terminal 30.

Then, the second clock signal CLK2 is supplied. When the second clock signal CLK2 is supplied, the first transistor M1 maintains a turn-on state so that the voltage VDD of the second clock signal CLK2 is supplied to the output terminal 30.

Here, when the voltage of the output terminal 30 increases by the voltage of the second clock signal CLK2, the gate electrode voltage of the first transistor M1 increases by the first capacitor C1 so that the first transistor M1 maintains a turn-on state. When the voltage of the output terminal 30 increases, the voltage of the first node N1 increases by the second capacitor C2. At this time, the voltage of the first node N1 increases to a voltage higher than the first power source VDD so that the threshold voltage of the first transistor M1 may be ideally set as 0V or about 0V.

That is, when the voltage of the first node N1 increases to a voltage higher than the first power source VDD, the voltage of the second gate electrode of the first transistor M1 is set as a voltage higher than the voltage of the source electrode. In this case, the threshold voltage of the first transistor M1 is reduced to about 0V so that the voltage of the second clock signal CLK2 may be output to the output terminal 30 without significant voltage loss.

On the other hand, in a period when the first and second clock signals CLK1 and CLK2 are supplied, the third power source VSS2 is supplied to the second gate electrode of the second transistor M2 so that the second transistor M2 stably maintains a turn-off state. The fourth transistor M4 that receives the fourth power source VSS3 from the second gate electrode also stably maintains the turn-off state.

Then, the third clock signal CLK3 is supplied so that the second transistor M2 and the fourth transistor M4 are turned on. When the second transistor M2 is turned on, the voltage of the second power source VSS1 is supplied to the output terminal 30. Then, the fourth transistor M4 is turned on, the voltage of the third power source VSS2 is supplied to the second gate electrode of the first transistor M1. At this time, the threshold voltage of the first transistor M1 is positively shifted so that the first transistor M1 stably maintains the turn-off state.

Figure 12:
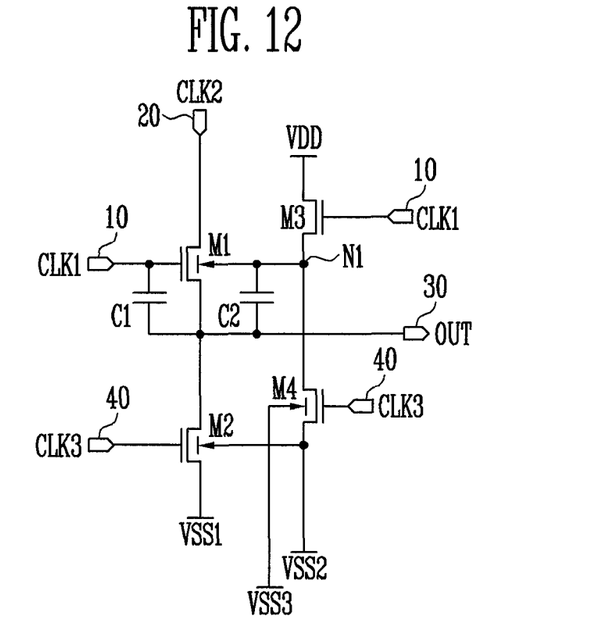
FIG. 12 is a view illustrating an inverter according to a fifth embodiment of the present invention.

FIG. 12 is a view illustrating an inverter according to a fifth embodiment of the present invention. In FIG. 12, the same elements as those of FIG. 10 are denoted by the same reference numerals and detailed description thereof will be omitted.

Figure 13:
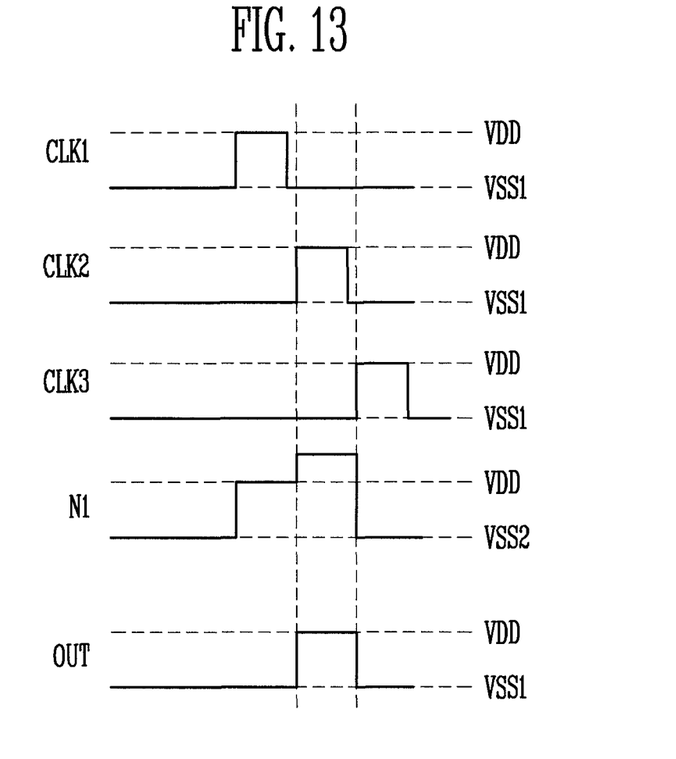
FIG. 13 is a waveform chart illustrating the driving processes of the inverter of FIG. 12.

Referring to FIG. 12, in the inverter according to the fifth embodiment of the present invention, the first electrode of the third transistor M3 is coupled to the first power source VDD. In this case, as illustrated in FIG. 13, the voltage supplied to the first node N1 when the first clock signal CLK1 is supplied is set as the voltage of the first power source VDD regardless of the threshold voltage of the third transistor M3. The other operation processes are substantially the same as those of the inverter illustrated in FIG. 10 and detailed description thereof will be omitted.

On the other hand, various types of circuits may be realized using the inverters according to the first to fifth embodiments of the present invention. For example, when an NMOS pixel is included and a stage circuit of a scan driver is formed of an NMOS transistor, the inverter according to the embodiments of the present invention may be applied. In this case, a stable operation may be realized regardless of the threshold voltage change characteristic of the NMOS transistor. Actually, the inverters according to the embodiments of the present invention may be applied to various circuits formed of NMOS so that the reliability of driving may be secured.

Figure 14:
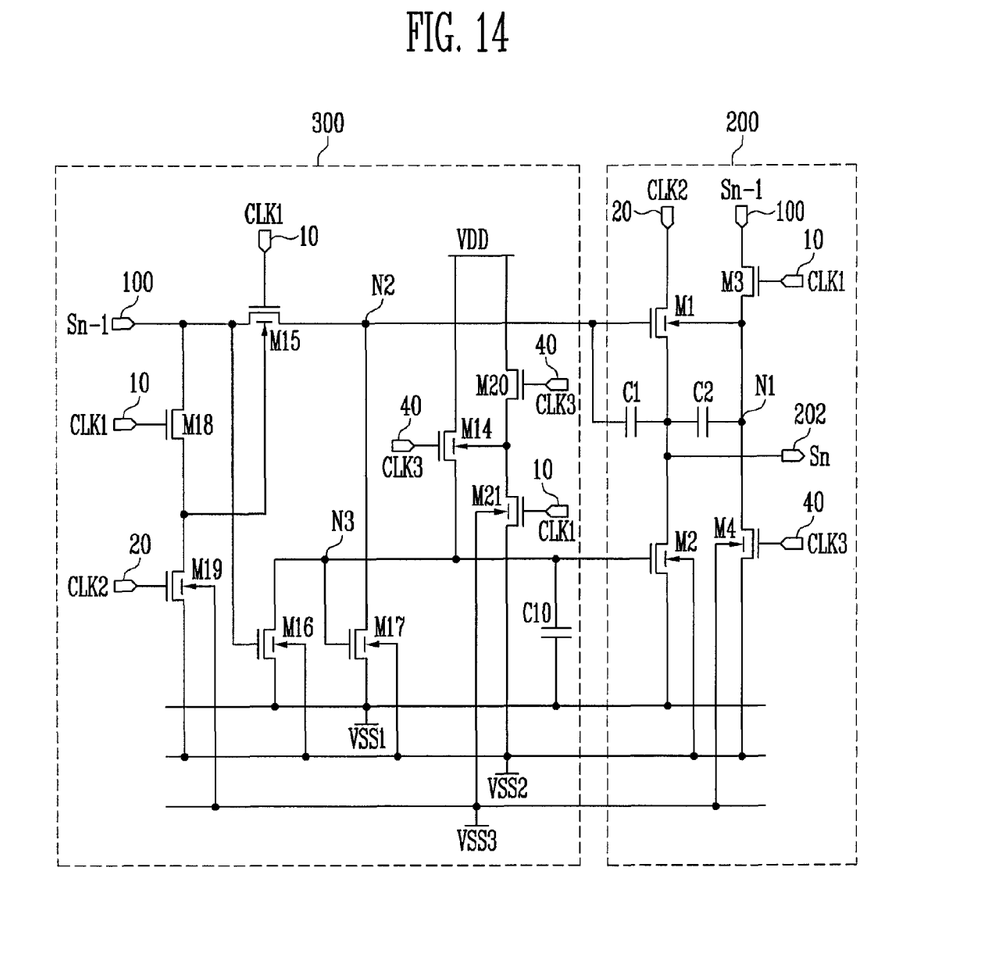
FIG. 14 is a view illustrating a stage circuit constructed using the inverter according to an embodiment of the present invention.

FIG. 14 is a view illustrating a stage circuit according to an embodiment of the present invention. The stage circuit is included in the scan driver and is coupled to the scan lines to supply scan signals. In FIG. 14, the transistors included in the stage are formed of N-type transistors (for example, NMOS transistors).

Figure 15:
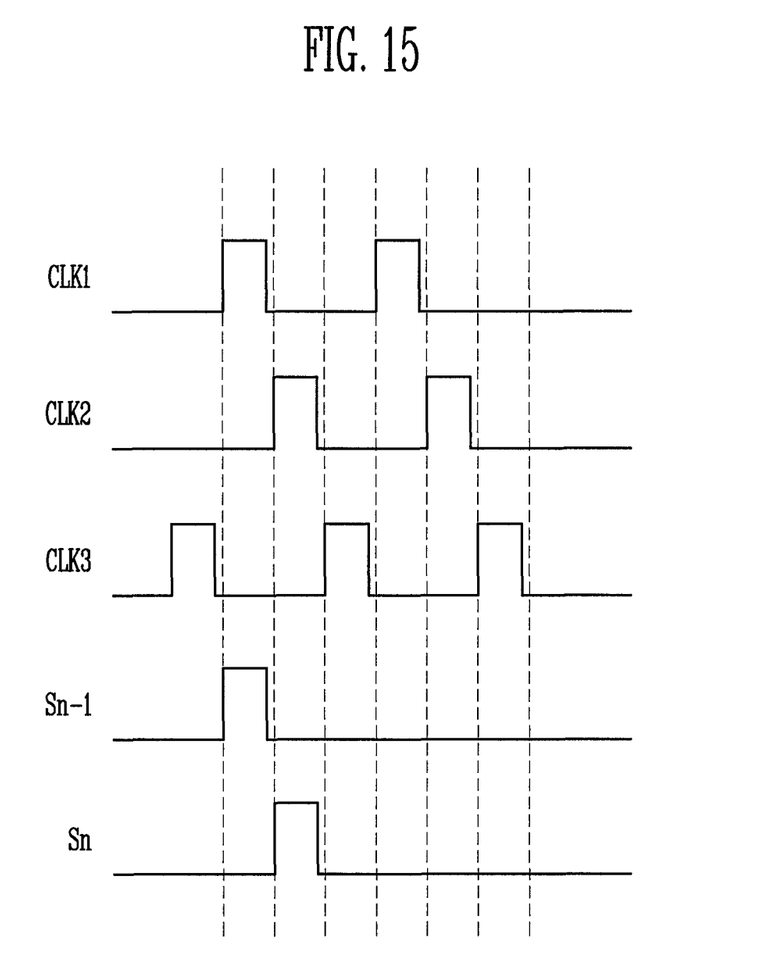
FIG. 15 is a waveform chart illustrating the driving processes of the stage circuit of FIG. 14.

Referring to FIG. 14, the stage circuit according to an embodiment of the present invention includes an inverter 200 and an input controller 300. The inverter 200 is formed of the inverter according to the fourth embodiment illustrated in FIG. 10. Here, the first electrode of the third transistor M3 is coupled to a stage input terminal 100. The stage input terminal 100 receives the sampling signal Sn-1 or the start signal of a previous stage. Here, the sampling signal Sn-1 or the start signal is supplied in synchronization with the first clock signal CLK1 as illustrated in FIG. 15. In this case, the operation processes of the inverter 200 are substantially the same as those of the fourth embodiment of the present invention.

On the other hand, the first gate electrode of the first transistor M1 included in the inverter 200 is coupled to a second node N2, and the first gate electrode of the second transistor M2 is coupled to a third node N3. Therefore, the inverter 200 controls the voltage supplied to an output terminal 202 to correspond to the voltages applied to the second node N2 and the third node N3.

The input controller 300 controls the voltages supplied to the second node N2 and the third node N3. Currently well-known suitable stage circuits may be used to control the outputs at the second node N2 and the third node N3. Therefore, an input controller 300 may be selected as one of currently well-known suitable circuits.

An embodiment of the present invention is constructed using inverter circuits so that the input controller 300 may stably control the voltages of the second node N2 and the third node N3. Therefore, the input controller 300 includes a plurality of transistors (a 14$^{th}$ transistor M14 to a 21$^{st}$ transistor M21) and a tenth capacitor C10.

The first electrode of the 14$^{th}$ transistor M14 is coupled to the first power source VDD, and the second electrode of the 14$^{th}$ transistor M14 is coupled to the third node N3. Then, the first gate electrode of the 14$^{th}$ transistor M14 is coupled to the third input terminal 40, and the second gate electrode of the 14$^{th}$ transistor M14 is coupled to the second electrode of a 20$^{th}$ transistor M20. The 14$^{th}$ transistor M14 is turned on or off to correspond to the third clock signal CLK3 supplied to the third input terminal 40.

The first electrode of a 15$^{th}$ transistor M15 is coupled to the stage input terminal 100, and the second electrode of the 15$^{th}$ transistor M15 is coupled to the second node N2. Then, the first gate electrode of the 15$^{th}$ transistor M15 is coupled to the first input terminal 10, and the second gate electrode of the 15$^{th}$ transistor M15 is coupled to the second electrode of an 18$^{th}$ transistor M18. The 15$^{th}$ transistor M15 is turned on or off to correspond to the first clock signal CLK1 supplied to the first input terminal 10.

The first electrode of a 16$^{th}$ transistor M16 is coupled to the third node N3, and the second electrode of the 16$^{th}$ transistor M16 is coupled to the second power source VSS1. Then, the first gate electrode of the 16$^{th}$ transistor M16 is coupled to the stage input terminal 100, and the second gate electrode of the 16$^{th}$ transistor M16 is coupled to the third power source VSS2. The 16$^{th}$ transistor M16 is turned on to correspond to the sampling signal or the start signal supplied to the stage input terminal 100.

The first electrode of a 17$^{th}$ transistor M17 is coupled to the second node N2, and the second electrode of the 17$^{th}$ transistor M17 is coupled to the second power source VSS1. Then, the first gate electrode of the 17$^{th}$ transistor M17 is coupled to the third node N3, and the second gate electrode of the 17$^{th}$ transistor M17 is coupled to the third power source VSS2. The 17$^{th}$ transistor M17 is turned on or off to correspond to the voltage applied to the third node N3.

The 18$^{th}$ transistor M18 is coupled between the stage input terminal 100 and the second gate electrode of the 15$^{th}$ transistor M15. Then, the gate electrode of the 18$^{th}$ transistor M18 is coupled to the first input terminal 10. The 18$^{th}$ transistor M18 is turned on or off to correspond to the first clock signal CLK1 supplied to the first input terminal 10.

The first electrode of a 19$^{th}$ transistor M19 is coupled to the second gate electrode of the 15$^{th}$ transistor M15, and the second electrode of the 19$^{th}$ transistor M19 is coupled to the third power source VSS2. Then, the first gate electrode of the 19$^{th}$ transistor M19 is coupled to the second input terminal 20, and the second gate electrode of the 19$^{th}$ transistor M19 is coupled to the fourth power source VSS3. The 19$^{th}$ transistor M19 is turned on or off to correspond to the second clock signal CLK2 supplied to the second input terminal 20.

The first electrode of the 20$^{th}$ transistor M20 is coupled to the first power source VDD, and the second electrode of the 20$^{th}$ transistor M20 is coupled to the second gate electrode of the 14$^{th}$ transistor M14. Then, the gate electrode of the 20$^{th}$ transistor M20 is coupled to the third input terminal 40. The 20$^{th}$ transistor M20 is turned on or off to correspond to the third clock signal CLK2 supplied to the third input terminal 40.

The first electrode of the 21$^{th}$ transistor M21 is coupled to the second gate electrode of the 14$^{th}$ transistor M14, and the second electrode of the 21th transistor M21 is coupled to the third power source VSS2. The first gate electrode of the 21$^{st}$ transistor M21 is coupled to the first input terminal 10, and the second gate electrode of the 21$^{st}$ transistor M21 is coupled to the fourth power source VSS3. The 21$^{st}$ transistor M21 is turned on or off to correspond to the first clock signal CLK1 supplied to the first input terminal 10.

The tenth capacitor C10 is coupled between the third node N3 and the second power source VSS1. The tenth capacitor C10 is charged with the voltage corresponding to the turn on or off operation of the second transistor M2.

FIG. 15 is a waveform chart illustrating the driving processes of the stage circuit of FIG. 14.

Referring to FIG. 15, the first clock signal CLK1 is supplied so that the third transistor M3, the 15$^{th}$ transistor M15, the 18$^{th}$ transistor M18, and the 21$^{st}$ transistor M21 are turned on. Then, the 16$^{th}$ transistor M16 is turned on to correspond to the previous stage sampling signal (or start signal) supplied in synchronization with the first clock signal CLK1.

When the third transistor M3 is turned on, the sampling signal is supplied to the first node N1. When the 15$^{th}$ transistor M15 is turned on, the sampling signal is supplied to the second node N2. When the sampling signal is supplied to the second node N2, the first transistor M1 is turned on so that the second input terminal 20 and the output terminal 202 are electrically coupled to each other. At this time, since the second clock signal is not supplied, a low signal is supplied to the output terminal 202.

When the 18$^{th}$ transistor M18 is turned on, the stage input terminal 100 and the second gate electrode of the 15$^{th}$ transistor M15 are electrically coupled to each other. In this case, the threshold voltage of the 15$^{th}$ transistor M15 is minimized or reduced so that the loss of the voltage of the sampling signal supplied to the second node N2 may be minimized.

When the 16$^{th}$ transistor M16 is turned on, the voltage of the second power source VSS1 is supplied to the third node N3. When the voltage of the second power source VSS1 is supplied to the third node N3, the second transistor M2 is turned off.

When the 21$^{st}$ transistor M21 is turned on, the voltage of the third power source VSS2 is supplied to the second gate electrode of the 14$^{th}$ transistor M14. At this time, the second power source VSS1 is supplied to the second electrode of the 14$^{th}$ transistor M14. In this case, the threshold voltage of the 14$^{th}$ transistor M14 is positively shifted so that the 14$^{th}$ transistor M14 may be stably turned off.

Then, the second clock signal CLK2 is supplied to the second input terminal 20. The second clock signal CLK2 supplied to the second input terminal 20 is supplied to the output terminal 202 via the first transistor M1. The second clock signal CLK2 supplied to the output terminal 202 is supplied to the scan line coupled thereto as a scan signal.

On the other hand, when the second clock signal CLK2 is supplied to the output terminal 202, the voltage of the first node N1 increases by the second capacitor C2 so that the threshold voltage of the first transistor M1 is minimized or reduced. Therefore, the second clock signal CLK2 may be supplied to the output terminal 202 without significant voltage loss. In addition, since the voltage of the second node N2 increases by the first capacitor C1 coupled to the output terminal 202, the first transistor M1 stably maintains a turn-on state.

Additionally, when the second clock signal CLK2 is supplied, the 19th transistor M19 is turned on. When the 19th transistor M19 is turned on, the voltage of the third power source VSS2 is supplied to the second gate electrode of the 15th transistor M15. In this case, the threshold voltage of the 15th transistor M15 is positively shifted so that the 15th transistor M15 maintains a stable turn-off state without a significant leakage current.

Then, the third clock signal CLK3 is supplied to the third input terminal 40. When the third clock signal CLK3 is supplied, the fourth transistor M4, the 14th transistor M14, and the 20th transistor M20 are turned on.

When the 14th transistor M14 is turned on, the voltage of the first power source VDD is supplied to the third node N3. When the voltage of the first power source VDD is supplied to the third node N3, the second transistor M2 and the 17th transistor M17 are turned on. When the second transistor M2 is turned on, the second power source VSS1 is supplied to the output terminal 202. When the 17th transistor M17 is turned on, the second power source VSS1 is supplied to the second node N2. When the second power source VSS1 is supplied to the second node N2, the first transistor M1 is turned off.

When the 20th transistor M20 is turned on, the voltage of the first power source VDD is supplied to the second gate electrode of the 14th transistor M14. In this case, the threshold voltage of the 14th transistor M14 is minimized or reduced so that the voltage loss of the first power source VDD supplied to the third node N3 may be minimized or reduced.

When the fourth transistor M4 is turned on, the third power source VSS2 is supplied to the first node N1. At this time, the threshold voltage of the first transistor M1 is positively shifted so that the first transistor M1 is stably turned off.

The above-described stage circuit is an embodiment of the present invention, and the present invention is not limited to the above. Actually, those skilled in the art may form various suitable stage circuits using the inverters according to the embodiments of the present invention.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An inverter comprising:
   a first transistor coupled between a first power source and an output terminal of the inverter, and having a first gate electrode coupled to a first input terminal of the inverter and a second gate electrode coupled to a third power source; and
   a second transistor coupled between the output terminal and a second power source, and having a first gate electrode coupled to a second input terminal of the inverter and a second gate electrode coupled to the third power source, wherein, in each of the first transistor and the second transistor, when a voltage supplied to the second gate electrode is lower than a voltage supplied to a source electrode thereof, a threshold voltage is positively shifted.

2. The inverter as claimed in claim 1,
   wherein the first power source is configured to output a voltage that is higher than a voltage of the second power source, and
   wherein the second power source is configured to output the voltage that is higher than a voltage of the third power source.

3. The inverter as claimed in claim 1, wherein, each of the first input terminal and the second input terminal receives the voltage of the second power source or the first power source.

4. The inverter as claimed in claim 1, wherein the first transistor and the second transistor are NMOS transistors.

5. The inverter as claimed in claim 1, further comprising:
   a third transistor coupled between the first power source and the second gate electrode of the first transistor, and having a gate electrode coupled to the first input terminal; and
   a fourth transistor coupled between the second gate electrode of the first transistor and the second power source, the fourth transistor being configured to be turned on or off to correspond to a voltage supplied to the second input terminal.

6. The inverter as claimed in claim 5,
   wherein the fourth transistor further comprises a second gate electrode, and
   wherein the second gate electrode of the fourth transistor is coupled to a fourth power source that is configured to output a voltage lower than the voltage of the third power source.

7. An inverter comprising:
   a first transistor coupled between a second input terminal of the inverter and an output terminal of the inverter, and having a first gate electrode coupled to a first input terminal of the inverter and a second gate electrode coupled to a first node;
   a first capacitor coupled between the first gate electrode of the first transistor and the output terminal;
   a second transistor coupled between the output terminal and a second power source, and having a first gate electrode coupled to a third input terminal and a second gate electrode coupled to a third power source;
   a third transistor having a first electrode coupled to a first power source or the first input terminal, a second electrode coupled to the first node, and a gate electrode coupled to the first input terminal;
   a second capacitor coupled between the first node and the output terminal; and
   a fourth transistor coupled between the first node and the third power source, and having a gate electrode coupled to the third input terminal.

8. The inverter as claimed in claim 7,
   wherein the first power source is configured to output a voltage that is higher than a voltage of the second power source, and
   wherein the second power source is configured to output the voltage that is higher than a voltage of the third power source.

9. The inverter as claimed in claim 7, wherein, in each of the first transistor and the second transistor, when a voltage supplied to the second gate electrode is lower than a voltage supplied to a source electrode thereof, a threshold voltage is positively shifted.

10. The inverter as claimed in claim 7, wherein a clock signal that rises from the voltage of the second power source to the voltage of the first power source is supplied to each of the first, second and third input terminals.

11. The inverter as claimed in claim 10, wherein the clock signal is supplied to the first, second and third input terminals in an order of the first input terminal, the second input terminal, and the third input terminal.

12. The inverter as claimed in claim 7, wherein the first to fourth transistors are NMOS transistors.

13. The inverter as claimed in claim 7,
wherein the fourth transistor further comprises a second gate electrode, and
wherein the second gate electrode of the fourth transistor is coupled to a fourth power source that is configured to output a voltage that is lower than the third power source.

14. A scan driver comprising stage circuits coupled to scan lines in order to sequentially supply scan signals to the scan lines,
wherein each of the stage circuits comprises the inverter as claimed in claim 1.

15. A scan driver comprising stage circuits coupled to scan lines in order to sequentially supply scan signals to the scan lines,
wherein each of the stage circuits comprises:
an inverter for supplying a corresponding one of the scan signals to an output terminal of the stage circuit to correspond to voltages respectively applied to a second node and a third node; and
an input controller for controlling the voltages applied to the second node and the third node,
wherein the inverter comprises:
a first transistor coupled between a second input terminal of the stage circuit and the output terminal, and having a first gate electrode coupled to the second node and a second gate electrode coupled to a first node;
a first capacitor coupled between the second node and the output terminal;
a second transistor coupled between the output terminal and a second power source, and having a first gate electrode coupled to the third node and a second gate electrode coupled to a third power source;
a third transistor coupled between a stage input terminal of the stage circuit and the first node, and having a gate electrode coupled to a first input terminal of the stage circuit;
a second capacitor coupled between the first node and the output terminal; and
a fourth transistor coupled between the first node and the third power source, and having a first gate electrode coupled to a third input terminal of the stage circuit and a second gate electrode coupled to a fourth power source.

16. The scan driver as claimed in claim 15, wherein a clock signal that rises from a voltage of the second power source to a voltage of a first power source is supplied to each of the first, second and third input terminals.

17. The scan driver as claimed in claim 16, wherein the clock signal is supplied to the first, second and third input terminals in an order of the first input terminal, the second input terminal, and the third input terminal.

18. The scan driver as claimed in claim 16,
wherein the first power source is configured to output a voltage that is higher than the voltage of the second power source,
wherein the second power source is configured to output the voltage that is higher than a voltage of the third power source, and
wherein the third power source is configured to output the voltage that is higher than a voltage of the fourth power source.

19. The scan driver as claimed in claim 15, wherein, in the transistors comprising the first gate electrode and the second gate electrode, when a voltage supplied to the second gate electrode is lower than a voltage supplied to a source electrode thereof, a threshold voltage is positively shifted.

20. The scan driver as claimed in claim 15, wherein transistors comprised in the inverter and the input controller are NMOS transistors.

21. The scan driver as claimed in claim 15, wherein a sampling signal or a start signal of a previous stage is input to the stage input terminal in synchronization with a clock signal supplied to the first input terminal.

22. The scan driver as claimed in claim 15, wherein the input controller comprises:
a fifth transistor coupled between a first power source and the third node, and having a first gate electrode coupled to the third input terminal;
a sixth transistor coupled between the stage input terminal and the second node, and having a first gate electrode coupled to the first input terminal;
a seventh transistor coupled between the third node and the second power source, and having a first gate electrode coupled to the stage input terminal and a second gate electrode coupled to the third power source;
an eighth transistor coupled between the second node and the second power source, and having a first gate electrode coupled to the third node and a second gate electrode coupled to the third power source;
a ninth transistor coupled between the stage input terminal and a second gate electrode of the sixth transistor, and having a gate electrode coupled to the first input terminal;
a tenth transistor coupled between the third power source and the second gate electrode of the sixth transistor, and having a first gate electrode coupled to the second input terminal and a second gate electrode coupled to the fourth power source;
an eleventh transistor coupled between the first power source and a second gate electrode of the fifth transistor, and having a gate electrode coupled to the third input terminal;
a twelfth transistor coupled between the second gate electrode of the fifth transistor and the third power source, and having a first gate electrode coupled to the first input terminal and a second gate electrode coupled to the fourth power source; and
a third capacitor coupled between the third node and the second power source.

* * * * *